United States Patent [19]
Schweighofer

[11] Patent Number: 6,028,476
[45] Date of Patent: Feb. 22, 2000

[54] POWER SWITCHED AMPLIFER

[75] Inventor: Peter Schweighofer, Nuremberg, Germany

[73] Assignee: Siemens Aktiengesellschaft, Munich, Germany

[21] Appl. No.: 09/119,966

[22] Filed: Jul. 21, 1998

[30] Foreign Application Priority Data

Jul. 23, 1997 [DE] Germany .............. 197 31 691

[51] Int. Cl.$^7$ .............. H03F 3/38; H03F 3/217

[52] U.S. Cl. .............. 330/10; 330/251

[58] Field of Search .............. 330/10, 207 A, 330/251

[56] References Cited

U.S. PATENT DOCUMENTS

| | | | |
|---|---|---|---|
| 4,363,001 | 12/1982 | Suzuki et al. | 330/107 |
| 4,600,891 | 7/1986 | Taylor, Jr. et al. | 330/10 |
| 5,113,145 | 5/1992 | Ideler et al. | . |
| 5,118,997 | 6/1992 | El-Hamamsy | 330/207 A |
| 5,617,058 | 4/1997 | Adrian et al. | 330/10 |

Primary Examiner—Robert Pascal
Assistant Examiner—Patricia T. Nguyen
Attorney, Agent, or Firm—Hill & Simpson

[57] ABSTRACT

A power switched amplifier has a switched output stage which generates an output stage voltage and a filter stage coupled to the switched output stage for smoothing the output stage voltage. The smoothing effect of the filter stage is made to be variable with a control signal. Given little outlay, such an amplifier is capable of generating a well-smoothed output voltage with a high voltage change rate.

11 Claims, 2 Drawing Sheets

POWER SWITCHED AMPLIFER

BACKGROUND OF THE INVENTION

1. Field of the Invention

The present invention is directed to a power switched amplifier of a type having a switched output stage which generates an output voltage, and a filter stage connected to the switched output stage for smoothing the output voltage. The present invention is further directed to a power switched amplifier of a type suitable for use as a gradient amplifier in a magnetic resonance tomography apparatus.

2. Description of the Prior Art

An amplifier which delivers steep output voltage edges and generally exhibits a low residual ripple, for example, for use as a gradient amplifier of a nuclear magnetic resonance tomography apparatus.

Generally, a nuclear magnetic resonance tomography apparatus has three gradient coils in which exactly regulated periodic currents respectively flow. For example, the current through each gradient coil in a cyclical current curve can reach values up to 300 A that must be adhered to with a precision in the mA range. The current curve can, for example, exhibit a cycle duration of 20 ms, whereby a current rise from 0 to 300 A within 1 ms can be required. In order to enable these rapid changes in current, a voltage up to, for example, ±300 V having as vertical an edge steepness as possible must be applied to the gradient coil.

Switched gradient amplifiers that, for example, work with a switching clock of 50 kHz are utilized in order to meet these demands, however, an undesired residual ripple (switching ripple) is produced in the output voltage by the switching. The residual ripple may cause resonance in sub-regions of the gradient coil, which is a complex structure with a plurality of local capacitances and inductivities. The high voltages thereby arising can produce local discharges that upset the patient and lead to image disturbances.

German OS 40 07 566 discloses a switched power amplifier of the type initially described. This amplifier has a filter arrangement that contains four assemblies, each with a series inductance and a smoothing capacitor.

In such a filter arrangement, however, the capacitance serving to smooth the output voltage cannot be very large because the maximum edge steepness of the output voltage would otherwise be too greatly diminished. Only a moderate filter effect therefore can be achieved.

The smoothing effect is also dependent on the switching clock frequency of the amplifier. A fast switching clock that exhibits a greater frequency separation from the useful signal is suppressed better by a low-pass filter. Given the high powers to be switched in the circumstances described above, however, an increase in the switching clock is only possible within certain limits and is also very complicated within these limits. A high switching clock causes high losses (that must be eliminated by cooling) and requires the use of more expensive components.

SUMMARY OF THE INVENTION

An object of the present invention is to provide a power switched amplifier that, given little outlay, is capable of generating a well-smoothed output voltage with a high rate of voltage change.

This object is achieved based on a recognition that high smoothing effect is required only in certain operating situations. In accordance with the invention, therefore, the smoothing effect of the filter arrangement is variable with a control signal, so that it can be matched to the current conditions. In many applications, for example, a certain residual ripple of the output voltage can be accepted when a fast rise or fall of this output voltage is to be produced. When, by contrast, the output voltage curve proceeds flat, the residual ripple should be suppressed as much as possible.

Due to this possibility of controlling the smoothing effect, the inventive amplifier need be designed for only a relatively low switching frequency without having to forego a strong filter effect. The amplifier is therefore economic in terms of manufacture and nonetheless supplies a high image quality given employment in a tomography apparatus.

The control signal is preferably generated by a control unit of the amplifier dependent on a rate of change to be achieved for an output voltage. In general, different criteria can be utilized for the control of the smoothing effect, these being based, for example, on specific operating conditions or specific critical signal shapes.

In one embodiment, the control unit obtains the information required for generating the control signal by measuring the output stage voltage of the amplifier. An input signal (reference value) of the amplifier, however, preferably is supplied to the control unit. In this case, the control unit can generate other control signals of the amplifier, for example pulse width modulated switching signals for switched components of the output stage.

The control signal can be an analog or digital signal. It can be composed of a number of sub-signals. In a preferred embodiment, only two control signal states are provided, for a high or a low smoothing, respectively. The high smoothing is set precisely when the rate of change of the output voltage is lower than a predetermined threshold.

For setting the filter effect, the filter arrangement preferably has a capacitor circuit with at least one control element. When a number of control elements are provided, then these are each supplied with one of the sub-signals of the control signal. Each control element is preferably connected in the current path of a respective capacitor.

The capacitor assembly can be composed of a number of capacitors in series and parallel circuitry. In a preferred embodiment, the capacitor assembly has two capacitors. These can be connected to one another in series, with the control element being connected in parallel with one capacitor (i.e. in the current path of the other capacitor). Alternatively, the capacitors can be arranged in parallel. The control element is then connected in series with one of the capacitors (i.e. in its current path).

The capacitance serving for smoothing the output stage voltage preferably is variable within broad limits, preferably by a factor of at least 10 or at least 30. For example, the capacitor assembly can have a first capacitor with a capacitance of 1 $\mu$F through 100 $\mu$F, preferably 10 $\mu$F, and a second capacitor having a capacitance of 30 nF through 3 $\mu$F, preferably 300 n F.

Further, a series inductance with, for example, 10 $\mu$H through 300 $\mu$H is preferably provided in the filter arrangement.

Depending on how many signal states the control signal can assume, the control element preferably acts as switch of a controllable resistor. The control element is preferably fashioned as MOSFET (MOS field effect transistor) or as bipolar transistor, particularly as an IGBT (insulated gate bipolar transistor).

DESCRIPTION OF THE PREFERRED EMBODIMENTS

Figure 1:
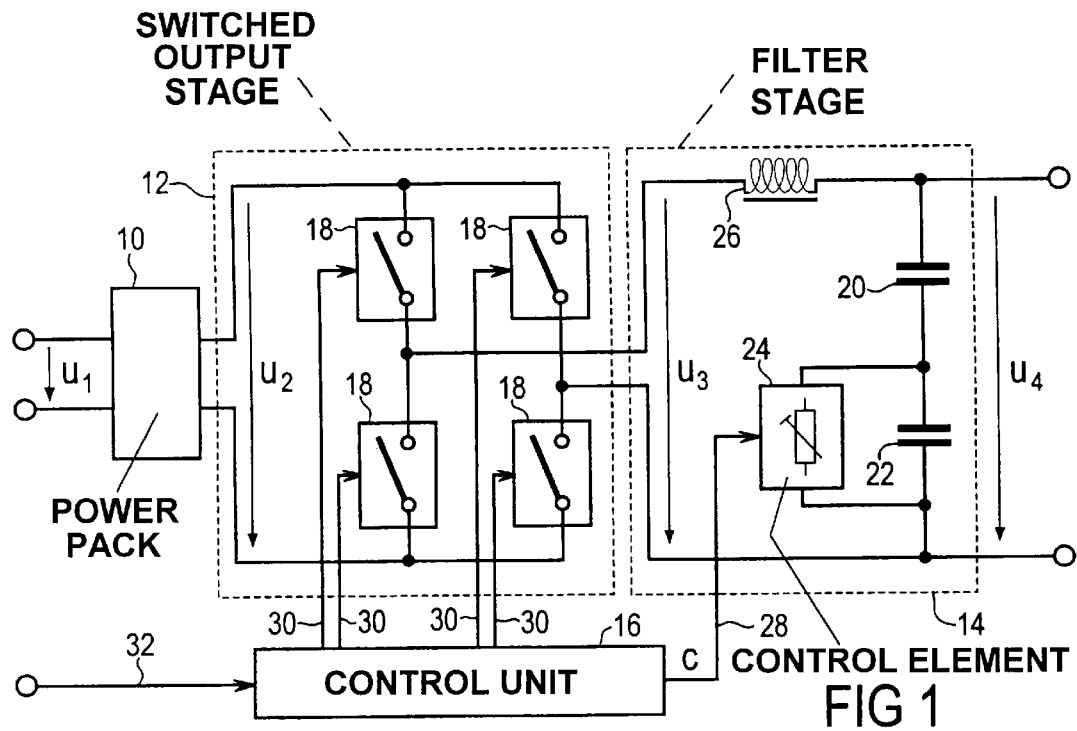
FIG. 1 is a circuit diagram of a first embodiment of the inventive amplifier.
Figure 2:
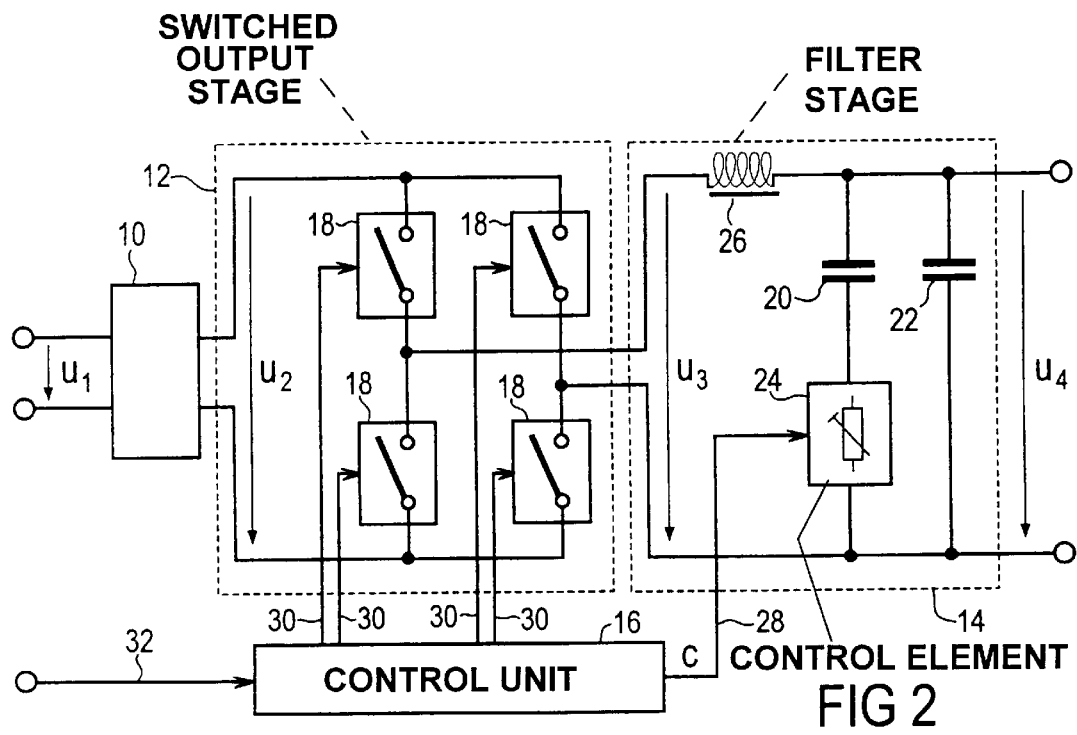
FIG. 2 is a circuit diagram of a second embodiment of the inventive amplifier.

Each amplifier embodiment in FIG. 1 and FIG. 2 has a power pack 10, a switched output stage 12, a filter stage 14 and a control unit 16 as the main assemblies of a gradient amplifier. From an input voltage $u_1$, the power pack 10 generates a stabilized intermediate circuit voltage $u_2$ across inputs of the switched output stage 12. In a known way, the switched output stage 12 is formed by a bridge circuit composed of four switched components 18 operated by a control unit 16. The switched components 18 are fashioned as power MOSFETs, each an unbiased diode. Two of the switched components 18 are switched as a pair in series and each pair is connected to the intermediate circuit voltage $u_2$. A pulse width-modulated output stage voltage $u_3$ that serves as the input voltage for the filter stage 14 is taken at the transverse bridge arm, i.e. at the respective junctions between each pair of switched components 18.

The filter stage 14 includes a capacitor assembly formed of two capacitors 20, 22 and a control element 24 and also has a series inductance 26 fashioned as a coil with an inductance of 50 µH. These components form a low-pass filter for smoothing the output stage voltage $u_4$. The smoothed voltage is supplied across inputs to a gradient coil (not shown) as the output voltage $u_4$ of the gradient amplifier.

The control unit 16 is connected to the control element 24 via a control line 28 and is connected via four switch lines 30 to the switched components 18, respectively. The control unit 16 has an input line 32 for a reference value signal.

In the circuit according to FIG. 1, the two capacitors 20, 22 of the capacitor assembly are connected in series. The first capacitor 20 has a capacitance of 10 µF, and the second capacitor 22 has a capacitance of 300 nF. The control element 24, whose structure is yet to be described, is connected in parallel with the second capacitor 22, i.e. in the current path of the first capacitor 20. When the control element 24 is transmissive, and thus bridges the second capacitor 22, the first capacitor 20 is effective for voltage smoothing with its full capacitance of 10 µF, causing a high filter effect to be achieved. When, by contrast, the control element 24 inhibits, then the filter effect is slight because the output voltage $u_4$ is across a capacitance of only approximately 290 nF. In intermediate stages of the conductivity of the control element 24, capacitances that lie between the aforementioned values and that are partially overlaid by the impedance of the control element 24 are effective for voltage smoothing.

In the alternative embodiment shown in FIG. 2, the first capacitor with 10 µF capacitance is connected in series with the control element 24. The second capacitor 22 with 300 nF capacitance is connected in parallel with the branch formed in this way. Depending on the level of conduction of the control element 24, the output voltage $u_4$ is across a capacitance between 300 nF and somewhat over 10 µF.

FIG. 2 shows an embodiment of the control element 24 formed by of an IGBT 34 that is connected into the shunt arm of a rectifier bridge formed of four diodes 36. The gate of the IGBT 34 is connected to the control line 28. The rectifier bridge assures that the IGBT 34 only has to switch a current flow in one direction.

Figure 4:
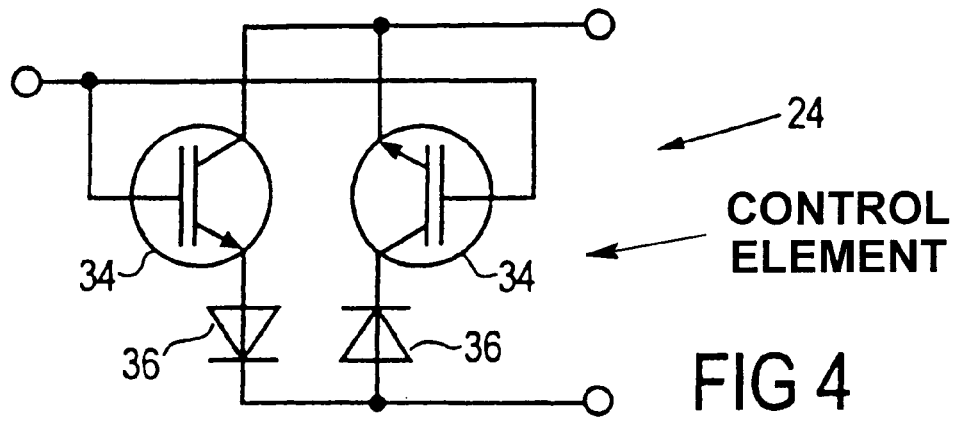
FIG. 4 is a circuit diagram of a second embodiment of a control element.

Two IGBTs 34 arranged with opposite polarity and each having a preceding diode are provided in the alternative embodiment according to FIG. 4. The IGBTs 34 are driven in common. i.e. the IGBTs 34 either both transmit or both inhibit depending on the control signal c on the control line 28. To that end, different drive signals must be applied to the gates of the IGBTs 34, since their emitters lie at different potentials. These drive signals are generated from the control signal c by a suitable circuit. In a further alternative embodiment based on the circuit of FIG. 4, drive the two IGBTs 34 are separately driven in order to be able to define the smoothing properties of the amplifier dependent on the direction of the current.

During operation of the exemplary embodiments of the gradient amplifier described herein, the control unit 16 generates four pulse width-modulated switching signals from the reference value signal (input signal) on the input line 32, these four pulse width-modulated switching signals being supplied respectively to the switched components 18 via the switch lines 30. Further, the control unit 16 generates a control signal c on the control line 28. The control signal c is a binary signal in order to place the control element 24 in either a transmissive condition or in an inhibited condition.

If the output voltage $u_4$ must rise or drop rapidly, for example given full modulation of the gradient amplifier, then a low capacitance of the capacitor assembly is set by switching the control element 24 (in the circuit according to FIG. 1 as well as in that according to FIG. 2) to a high-impedance condition. When the desired output voltage $u_4$ is reached, the control element 24 is through-connected, so that the larger capacitor 20 becomes effective for voltage smoothing. Overall, thus, the time constant of the low-pass formed by the series inductance 26 and the capacitor assembly is suitably varied.

In an alternative embodiment, the control signal c generated by the control unit 16 is an analog signal. The control element 24 then acts as a controllable resistor. A number of different smoothing intensities thus can be set dependent on the desired rate of change of the output voltage $u_4$.

Figure 3:
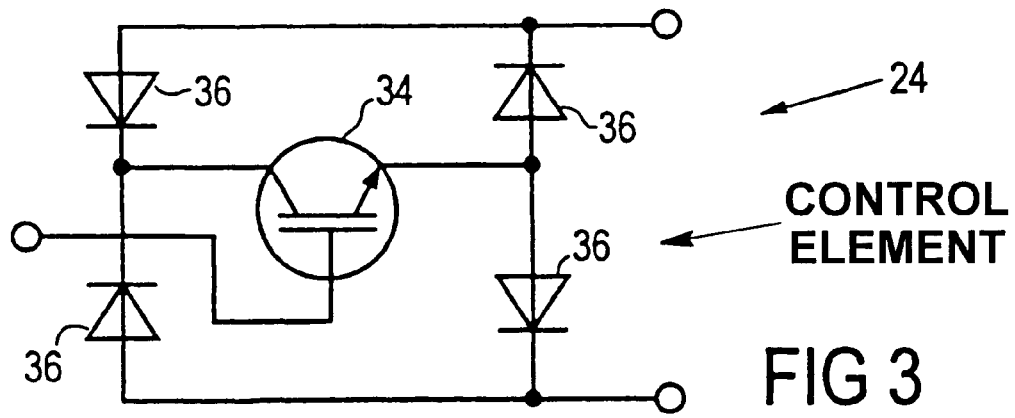
FIG. 3 is a circuit diagram of a first embodiment of a control element.

The inventors currently view the gradient amplifier according to FIG. 1 with a control element according to FIG. 3 and a binary control signal c to be the best way of implementing the invention.

Although modifications and changes may be suggested by those skilled in the art, it is the intention of the inventor to embody within the patent warranted hereon all changes and modifications as reasonably and properly come within the scope of his contribution to the art.

I claim as my invention:

1. A power switched amplifier comprising:

a switched output stage which generates an output stage voltage at an output of said output stage;

filter means connected to said output of said output stage for smoothing said output stage voltage, said filter means having a variable filter effect which acts on said output stage voltage to produce an amplifier output voltage; and control means for generating a control signal supplied to said filter means for varying said filter effect dependent on a rate of change to be achieved for said amplifier output voltage.

2. A power switched amplifier as claimed in claim 1 further comprising means for identifying when said rate of change of said amplifier output voltage exceeds a threshold, and wherein said control means comprises means for setting said control signal at a first control signal level when said rate of change of said amplifier output voltage exceeds said threshold, and otherwise setting said control signal to a second control signal level.

3. A power switched amplifier comprising:

a switched output stage which generates an output stage voltage at an output of said output stage;

filter means connected to said output of said output stage for smoothing said output stage voltage, said filter means having a variable filter effect which acts on said output stage voltage; and means for generating a control signal supplied to said filter means for varying said filter effect, said filter means comprising: a capacitance having a current path connected across said output voltage, and a control element in said current paths supplied and driven by said control signal.

4. A power switched amplifier as claimed in claim 3 wherein said control element comprises an element functioning as a switch actuatable by said control signal.

5. A power switched amplifier as claimed in claim 3 wherein said control element comprises an element functioning as a resistor having a resistance controllable by said control signal.

6. A power switched amplifier as claimed in claim 3 wherein said control element comprises a rectifier bridge formed by four diodes, and having a rectifier bridge shunt arm, and wherein said control element comprises an IGBT connected in said rectifier bridge shunt arm.

7. A power switched amplifier as claimed in claim 3 wherein said capacitance comprises a capacitance which is variable by said control signal by a factor of at least 10.

8. A power switched amplifier as claimed in claim 7 wherein said capacitance comprises a capacitor which is variable by said control signal by a factor of at least 30.

9. A power switched amplifier as claimed in claim 3 wherein said capacitance comprises two capacitors connected in series across said output stage voltage, and wherein said control element is connected in parallel with one of said two capacitors.

10. A power switched amplifier as claimed in claim 3 wherein said capacitance comprises two capacitors connected in parallel across said output stage voltage, and wherein one of said two capacitors is connectable and disconnectable across said output stage voltage by said control element.

11. A power switched amplifier as claimed in claim 3 wherein said filter means further comprises an inductance connected in series with said capacitance.

* * * * *